US012804873B2

(12) United States Patent
Yamashita et al.

(10) Patent No.: US 12,804,873 B2
(45) Date of Patent: Nov. 17, 2026

(54) MANAGEMENT DEVICE, MANAGEMENT METHOD, AND WORK DEVICE

(71) Applicant: FUJI CORPORATION, Chiryu (JP)

(72) Inventors: Yukihiro Yamashita, Toyohashi (JP); Fumiya Mizutani, Toyota (JP); Taehune Kim, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 348 days.

(21) Appl. No.: 18/248,096

(22) PCT Filed: Nov. 10, 2020

(86) PCT No.: PCT/JP2020/041945

§ 371 (c)(1),
(2) Date: Apr. 6, 2023

(87) PCT Pub. No.: WO2022/101992

PCT Pub. Date: May 19, 2022

(65) Prior Publication Data

US 2023/0371224 A1 Nov. 16, 2023

(51) Int. Cl.
*H05K 13/08* (2006.01)

(52) U.S. Cl.
CPC ....... *H05K 13/086* (2018.08); *H05K 13/0882* (2018.08)

(58) Field of Classification Search
None
See application file for complete search history.

(56) References Cited

U.S. PATENT DOCUMENTS

2019/0261543 A1* 8/2019 Osaki ................. H05K 13/0419

FOREIGN PATENT DOCUMENTS

WO WO 2019/229924 A1 12/2019
WO WO 2020/039544 A1 2/2020

OTHER PUBLICATIONS

International Search Report issued Jan. 19, 2021 in PCT/JP2020/041945 filed on Nov. 10, 2020 2 pages.

* cited by examiner

*Primary Examiner* — Sean Shechtman
(74) *Attorney, Agent, or Firm* — Oblon, McClelland, Maier & Neustadt, L.L.P.

(57) ABSTRACT

In a case where a target feeder to be used in a target job is pre-served, a management device determines whether a predetermined slot of the target feeder overlaps with a predetermined slot of a feeder to be used in a preceding job executed prior to the target job. When predetermined slots of both feeders do not overlap with each other, the management device pre-serves the target feeder in the predetermined slot of the target feeder. On the other hand, when the predetermined slots of both feeders overlap with each other, the management device serves the target feeder to the predetermined slot of the target feeder after an execution of a preceding job which uses a feeder of which a predetermined slot overlaps with the predetermined slot of the target feeder is completed.

6 Claims, 8 Drawing Sheets

Fig. 6

| POSITION INFORMATION | | FEEDER INFORMATION | | |
|---|---|---|---|---|
| LOCATION | SLOT | FEEDER ID | COMPONENT TYPE | COMPONENT REMAINING NUMBER |
| FEEDER STORAGE | #1 | *** | *** | *** |
| | #2 | *** | *** | *** |
| | #3 | *** | *** | *** |
| | ⋮ | ⋮ | ⋮ | ⋮ |
| MOUNTING MACHINE 1 SUPPLY AREA | #1 | *** | *** | *** |
| | #2 | *** | *** | *** |
| | #3 | *** | *** | *** |
| | ⋮ | ⋮ | ⋮ | ⋮ |
| MOUNTING MACHINE 1 BUFFER AREA | #1 | *** | *** | *** |
| | #2 | *** | *** | *** |
| | #3 | *** | *** | *** |
| | ⋮ | ⋮ | ⋮ | ⋮ |

Fig. 7

| PRODUCTION ORDER | COMPONENT ARRANGEMENT INFORMATION | | | | | |
|---|---|---|---|---|---|---|
| | #1 | #2 | #3 | #4 | #5 | #6 |
| JOB1 | *** | *** | *** | *** | *** | *** |
| JOB2 | *** | *** | *** | *** | *** | *** |
| JOB3 | *** | *** | *** | *** | *** | *** |

MANAGEMENT DEVICE, MANAGEMENT METHOD, AND WORK DEVICE

TECHNICAL FIELD

The present specification discloses a management device, a management method, and a work device for use in a component mounting system.

BACKGROUND ART

Conventionally, in a component mounting system including a component mounting machine including multiple mounting target attachment sections (slots) to which a feeder is attached and a mounting section that picks up and mounts a component from the feeder attached to the mounting target attachment section, and a mobile work device that performs collecting the feeder from the mounting target attachment section and serving the feeder to the mounting target attachment section, in a case where there are empty spaces in the mounting target attachment sections, a feeder to be used for production (job) from the next time is pre-served in an empty mounting target attachment section by the mobile work device (refer to Patent Literature 1, for example).

PATENT LITERATURE

Patent Literature 1: International Publication No. WO 2020/039544

BRIEF SUMMARY

Technical Problem

In a case where prepared feeders are pre-served in the empty mounting target attachment sections (empty slots) in order, the feeders may not be pre-served in the order in which the use is started due to delays in the preparation of some feeders or the like. For example, in a case where a feeder (having a lower priority) to be used in a later production is pre-served and then a feeder (having a higher priority) to be used in an earlier production is served, when another feeder having a lower priority is already attached to the slot at the serving destination, the feeder having a lower priority needs to be detached once, and then, the feeder having a higher priority is attached. Therefore, in the conventional method, it takes time to perform serving work, and there is a case where the serving of the feeder is not efficient.

A principal object of the present disclosure is to efficiently perform serving of a feeder by avoiding wasteful detachment work of the feeder.

Solution to Problem

The present disclosure employs the following means in order to achieve the above-described principle object.

The management device of the present disclosure is a management device for use in a component mounting system including a component mounting machine having multiple slots to which a feeder is attached and a mounting section configured to execute a mounting job for mounting a component by detaching the component from the feeder, and a work device configured to perform serving work and collecting work of the feeder for each slot of the component mounting machine, the device including a management control section configured to, in a case where a target feeder to be used in a target job among multiple mounting jobs to be executed by the component mounting machine is pre-served in the component mounting machine, determine whether a predetermined slot, which is a predetermined serving destination slot of the target feeder, overlaps with a predetermined slot of a feeder to be used in a preceding job executed prior to the target job, cause the work device to pre-serve the target feeder in the predetermined slot of the target feeder when predetermined slots of both feeders do not overlap with each other, and cause the work device to serve the target feeder in the predetermined slot of the target feeder after an execution of a preceding job which uses a feeder of which a predetermined slot overlaps with the predetermined slot of the target feeder is completed when the predetermined slots of both feeders overlap with each other.

In a case where the target feeder to be used in the target job is pre-served, the management device of the present disclosure determines whether the predetermined slot (predetermined serving destination slot) of the target feeder overlaps with the predetermined slot of the feeder to be used in the preceding job to be executed prior to the target job. Then, when the predetermined slots of both feeders do not overlap with each other, the target feeder is pre-served in the predetermined slot of the target feeder. On the other hand, when the predetermined slots of both feeders overlap with each other, after the execution of the preceding job which uses the feeder of which a predetermined slot overlaps with the predetermined slot of the target feeder is completed, the target feeder is served to the predetermined slot of the target feeder. As a result, even if it is necessary to serve a feeder having a high priority later, a predetermined slot of the feeder having the high priority can be left empty. Therefore, it is possible to more efficiently perform the serving of the feeder by avoiding wasteful detachment work of the feeder.

BRIEF DESCRIPTION OF DRAWINGS

FIG. 6 is an explanatory diagram illustrating an example of feeder holding information.

FIG. 7 is an explanatory diagram illustrating an example of component arrangement information.

DESCRIPTION OF EMBODIMENTS

Next, an embodiment of the present disclosure will be described while referring to accompanying drawings.

Figure 1:
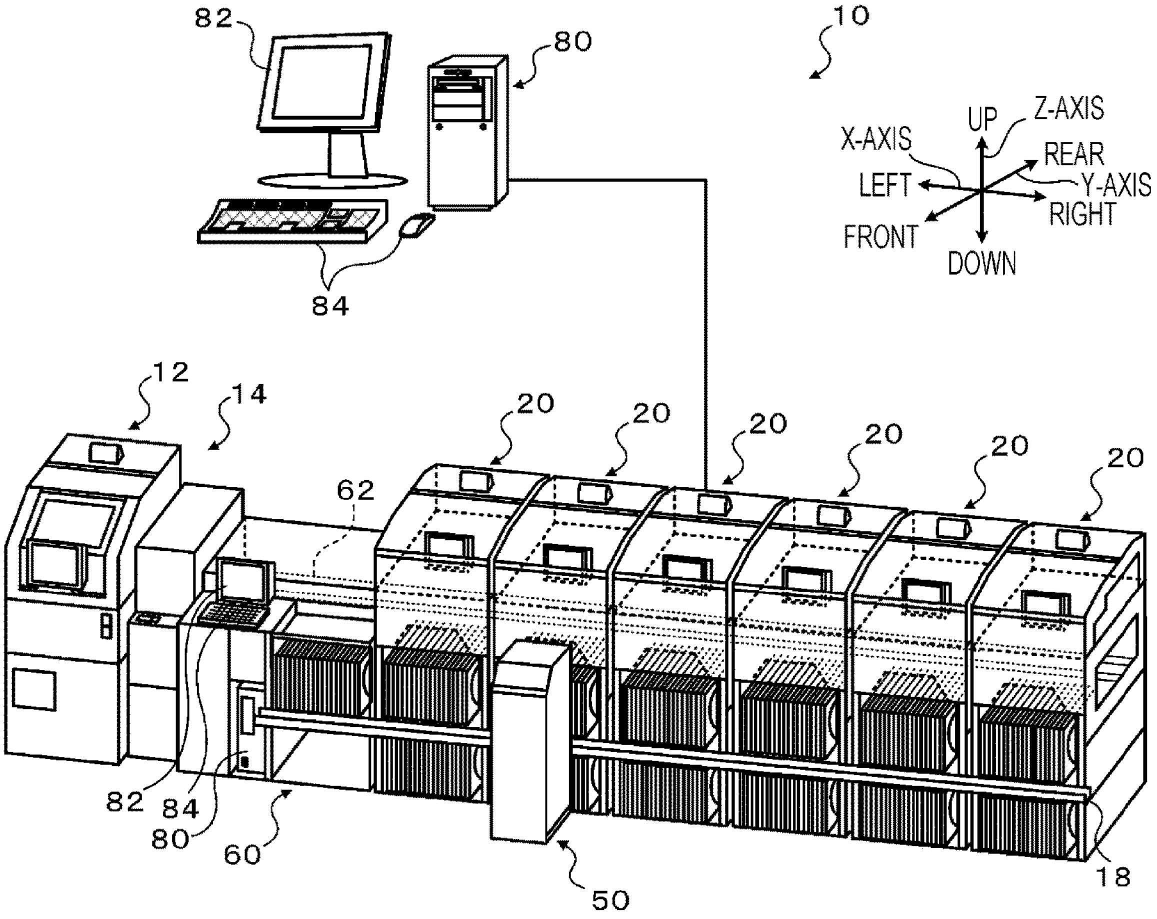
FIG. 1 is a schematic configuration diagram of a component mounting system.
Figure 2:
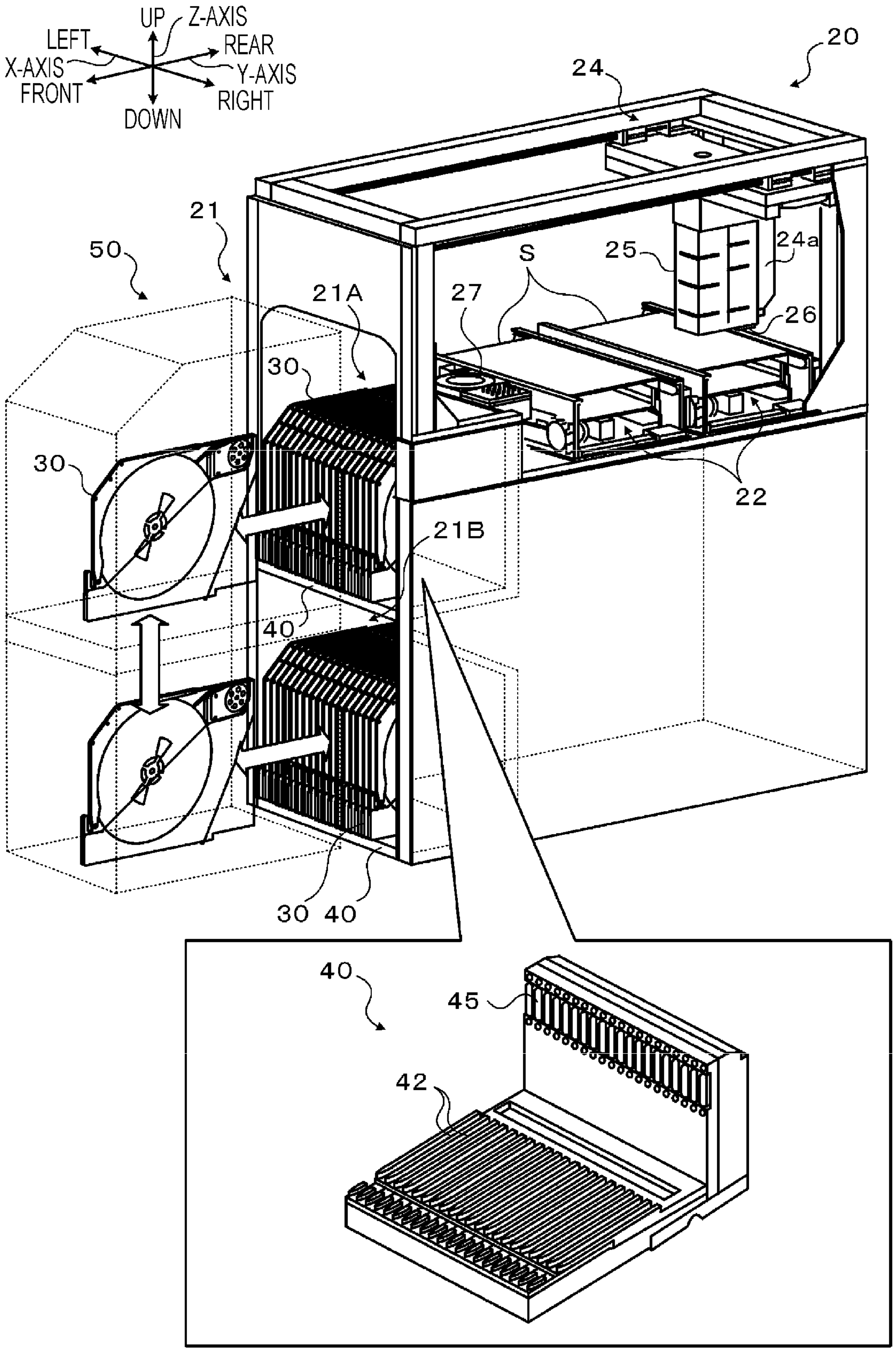
FIG. 2 is a schematic configuration diagram of a component mounting machine and a feeder.
Figure 3:
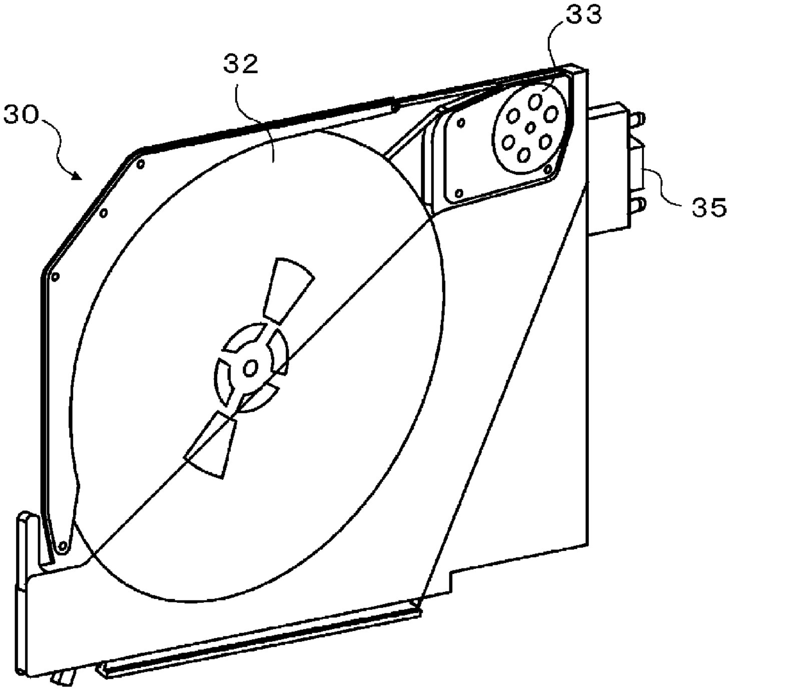
FIG. 3 is a schematic configuration diagram of the feeder.
Figure 4:
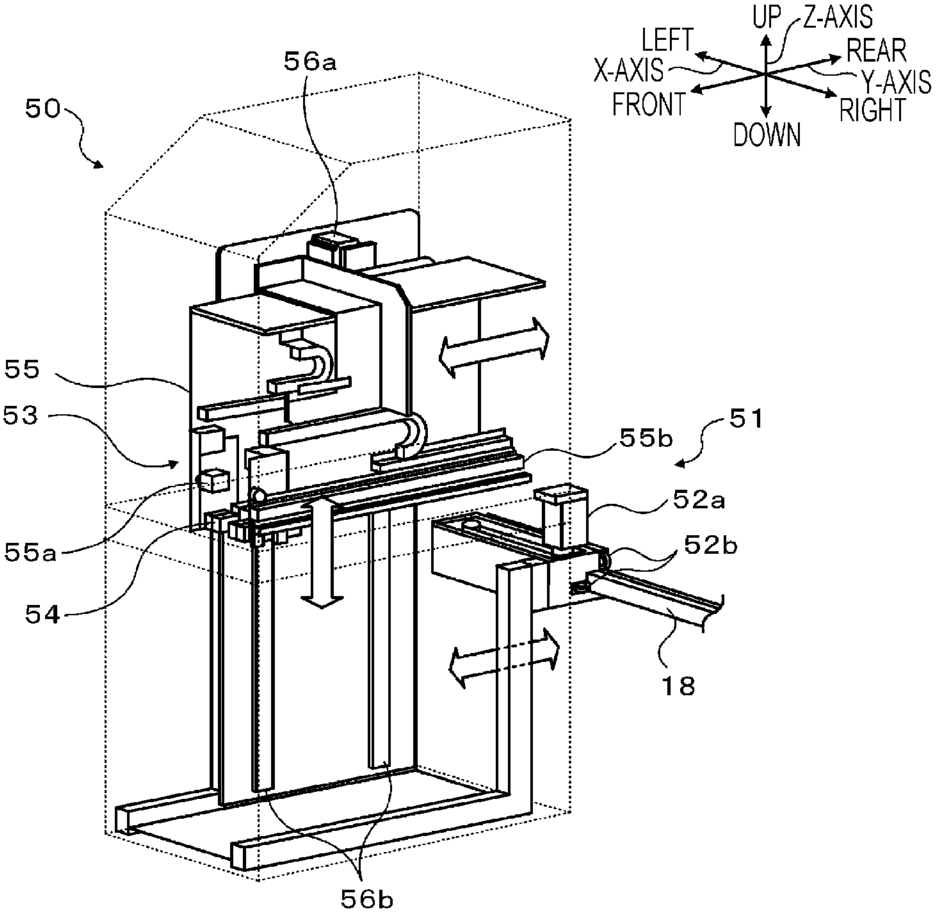
FIG. 4 is a schematic configuration diagram of a loader.
Figure 5:
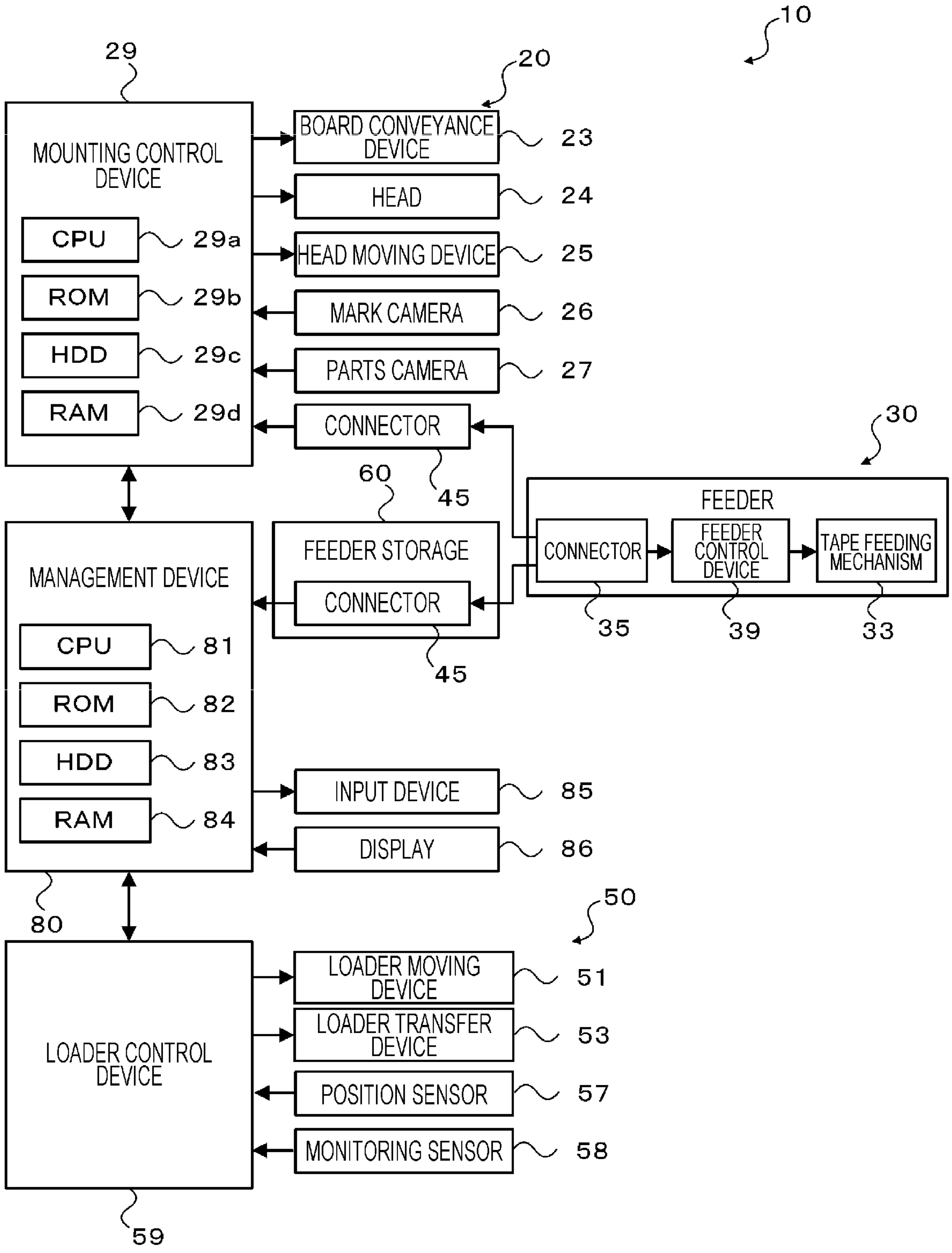
FIG. 5 is a block diagram illustrating electrical connection relationships of the component mounting system.

FIG. 1 is a schematic configuration diagram of a component mounting system. FIG. 2 is a schematic configuration diagram of a component mounting machine and a feeder base. FIG. 3 is a schematic configuration diagram of a feeder. FIG. 4 is a schematic configuration diagram of a loader. FIG. 5 is a block diagram illustrating electrical connection relationships of the component mounting system. In FIGS. 1, 2, and 4, a left-right direction is defined as an X-axis direction, a front-rear direction is defined as a Y-axis direction, and an up-down direction is defined as a Z-axis direction.

Component mounting system 10 produces a board on which components are mounted on board S, and as illustrated in FIG. 1, includes printing device 12, print inspection device 14, multiple component mounting machines 20, mount inspection device (not illustrated), loader 50, feeder storage 60, and management device 80 that manages the entire system. Printing device 12 prints solder on a front surface of board S. Print inspection device 14 inspects a state of the solder printed by printing device 12. Component mounting machine 20 picks up a component supplied from feeder 30 by a suction nozzle (pickup member) and mounts the component on board S. The mount inspection device inspects a mounting state of the component mounted by component mounting machine 20. Printing device 12, print inspection device 14, multiple component mounting machines 20, and mount inspection device are arranged in this order from an upstream side along a conveyance direction of board S to constitute a production line.

As illustrated in FIG. 2, component mounting machine 20 includes attachment target section 21 to which feeder 30 is attached, board conveyance device 22 that conveys board S in the X-axis direction, head 25 that picks up a component from feeder 30 and mounts the same on board S, head moving device 24 that causes head 25 to move in a horizontal direction (XY-axis direction), and mounting control device 29 (refer to FIG. 5). Although not illustrated, head 25 includes a suction nozzle for picking up the component and a lifting and lowering device for lifting and lowering the suction nozzle. Head moving device 24 includes slider 24*a* to which head 25 is attached, and causes slider 24*a* to move in the horizontal direction (XY-axis direction).

As illustrated in FIG. 3, feeder 30 is a cassette type tape feeder and includes tape reel 32, tape feeding mechanism 33, connector 35, and feeder control device 39 (refer to FIG. 5). Tape reel 32 is wound with a tape in which components are accommodated. Components are protected by a film covering a surface of the tape. Tape feeding mechanism 33 pulls the tape from tape reel 32 and feeds the tape to a component supply position. The component accommodated in the tape is in a state of being exposed at the component supply position by peeling off the film before the component supply position, and is picked up by head 25 (suction nozzle). Feeder control device 39 includes a well-known CPU, ROM, RAM, and the like, and outputs a drive signal to tape feeding mechanism 33 (feeding motor).

Attachment target section 21 is provided on a front surface side (front part) of component mounting machine 20, and has two upper and lower areas in which feeder 30 can be set. An upper area is supply area 21A in which feeder 30 can supply the component to a position where head 25 can pick up (component supply position), and a lower area is buffer area 21B for temporarily storing feeder 30. Feeder base 40 is installed in each of areas 21A and 21B. As illustrated in FIG. 2, feeder base 40 in each of areas 21A and 21B has multiple slots 42 to and from which feeder 30 is attached and detached, and multiple connectors 45 electrically connected to connectors 35 of feeder 30 attached to the corresponding slots 42. Feeder 30 accommodating components used in a running job (production) is attached in supply area 21A. In addition, in a case where there are empty slots 42 in supply area 21A, spare feeder 30 for supplying the same type of component in place of feeder 30 which is in component shortage during production, feeder 30 accommodating components to be used in jobs to be executed from the next time, and the like are also attached. Buffer area 21B is used to temporarily store feeder 30 accommodating components to be used in jobs to be executed from the next time, or to temporarily store used feeder 30.

Component mounting machine 20 also includes mark camera 26, parts camera 27, and the like. Mark camera 26 images a reference mark attached to board S from above in order to detect the position of board S. Parts camera 27 images an image of a component picked up by the suction nozzle from below in order to detect a pickup error or a pickup deviation.

Mounting control device 29 includes well-known CPU 29*a*, ROM 29*b*, HDD 29*c*, RAM 29*d*, and the like. Mounting control device 29 inputs image signals from mark camera 26 and parts camera 27. In addition, mounting control device 29 outputs drive signals to board conveyance device 22, head 25, head moving device 24, and the like.

In addition, mounting control device 29 is communicably connected to feeder control device 39 of feeder 30 attached to feeder base 40 via connectors 35 and 45. When feeder 30 is attached, mounting control device 29 receives feeder information, such as a feeder ID, a component type, and a component remaining number, included in feeder control device 39 of feeder 30 from feeder control device 39. In addition, mounting control device 29 transmits the received feeder information and an attachment position (slot number) where feeder 30 is attached to management device 80.

CPU 29*a* of mounting control device 29 executes mounting process for mounting a component on board S. CPU 29*a* causes head 25 to move above the component supply position of feeder 30 by head moving device 24. Subsequently, CPU 29*a* lowers the suction nozzle by the lifting and lowering device to cause the suction nozzle to pick up the component. CPU 29*a* causes the component picked up by the suction nozzle to move above parts camera 27 by head moving device 24, and images the component by parts camera 27. CPU 29*a* processes the captured image of the component, measures the pickup deviation amount of the component, and corrects the mounting position of the component on board S. Then, CPU 29*a* causes the component picked up by the nozzle to move above the mounting position after correction by head moving device 24, and lowers the suction nozzle by the lifting and lowering device to mount the component on board S.

Feeder storage 60 is a storing place that is incorporated in a production line and temporarily stores multiple feeders 30. In feeder storage 60, a feeder base provided with multiple slots 42 and multiple connectors 45 similar to feeder base 40 of component mounting machine 20 is installed. In feeder storage 60, feeder 30 which is in use plan is provided or used feeder 30 is collected by an automatic conveyance vehicle (AGV) or an operator (not illustrated). When feeder 30 is attached to connector 45 of feeder storage 60, feeder information, such as a feeder ID, a component type, and a component remaining number, included in feeder 30, and the attachment position (slot number) where feeder 30 is attached are transmitted to management device 80.

As illustrated in FIG. 1, loader 50 moves in front of component mounting system 10 (production line) along the line to detach feeder 30 which is in use plan from feeder storage 60 and provide it to each component mounting machine 20, or to collect used feeder 30 from each component mounting machine 20 and carry the feeder to feeder storage 60. As illustrated in FIG. 4, loader 50 includes loader moving device 51, feeder transfer device 53, and loader control device 59 (refer to FIG. 5). Loader moving device 51 causes loader 50 to move along guide rail 18 arranged in front of the production line. Loader moving device 51 includes X-axis motor 52*a* that drives a driving belt for moving loader 50, and guide roller 52*b* that rolls on guide rail 18 to guide the movement of loader 50. Feeder transfer device 53 transfers feeder 30 between component mounting machine 20 and loader 50 at a position where loader 50 faces any of component mounting machines 20, or transfers feeder 30 between feeder storage 60 and loader 50 at a position where loader 50 faces feeder storage 60. Feeder transfer device 53 includes Y-axis slider 55 and Z-axis motor 56*a* for moving Y-axis slider 55 along Z-axis guide rail 56*b*. Y-axis slider 55 includes clamp section 54 for clamping feeder 30, and Y-axis motor 55*a* for moving clamp section 54 along Y-axis guide rail 55*b*. Y-axis slider 55 is lifted and lowered by the driving of Z-axis motor 56*a*. Feeder transfer device 53 lifts Y-axis slider 55, so that Y-axis slider 55 faces feeder base 40 of supply area 21A of component mounting machine 20 and feeder base 40 of feeder storage 60, and feeder transfer device 53 clamps feeder 30 with clamp section 54 in this state and moves feeder 30 in Y-axis direction by Y-axis slider 55, thereby transferring feeder 30 to supply area 21A and feeder storage 60. Feeder transfer device 53 lowers Y-axis slider 55, so that Y-axis slider 55 faces buffer area 21B of component mounting machine 20, and feeder transfer device 53 clamps feeder 30 with clamp section 54 in this state and moves feeder 30 in Y-axis direction by Y-axis slider 55, thereby transferring feeder 30 to buffer area 21B. Loader control device 59 includes a well-known CPU, ROM, RAM, and the like, inputs signals from position sensor 57 for detecting a traveling position or monitoring sensor 58 for detecting the presence or absence of an obstacle in the vicinity, and outputs drive signals to loader moving device 51 and feeder transfer device 53.

Management device 80 is a general-purpose computer, and as illustrated in FIG. 5, includes CPU 81, ROM 82, HDD 83 (storage device), and RAM 84. Input device 85 such as a keyboard and a mouse, and display 86 are electrically connected to management device 80. In addition to the production schedule, HDD 83 stores feeder holding information, job information, status information, and the like as various information required for production. These pieces of information are managed for each component mounting machine 20. Here, the production schedule is a schedule that specifies which components are mounted on which board S in which order in each component mounting machine 20, how many boards S (products) mounted in that manner are manufactured, and the like. The feeder holding information is information as to feeder 30 held by each component mounting machine 20 and feeder storage 60. As illustrated in FIG. 6, the feeder holding information includes feeder information such as a feeder ID, a component type, and a component remaining number, and position information such as a device (location) holding feeder 30 (component) and an attachment position (slot number) of feeder 30. The job information is information as to the mounting process (job) to be executed by each component mounting machine 20. The job information includes the type of board to be produced, the type of component to be mounted, a mounting position for each component, and an arrangement position (arrangement position information) of a component to be arranged in supply area 21A for each job. The arrangement position information of the component indicates a predetermined attachment position (predetermined slot) of feeder 30 accommodating the components, and is managed for each component mounting machine 20. As illustrated in FIG. 7, the arrangement position information stores execution procedures of jobs and the type of component to be arranged for each slot 42 in supply area 21A in association with each other. The status information is information indicating the operation status of each component mounting machine 20. The status information includes during the production, during setup change, during abnormality occurrence, and the like.

Management device 80 is communicably connected to mounting control device 29 by wire, and exchanges various information with each component mounting machine 20 of component mounting system 10. Management device 80 receives the operation status from each component mounting machine 20 and updates the status information to the latest one. In addition, management device 80 is communicably connected to feeder control device 39 of feeder 30 attached to feeder base 40 of each component mounting machine 20 via mounting control device 29. When feeder 30 is detached from component mounting machine 20 or feeder storage 60, or is attached to component mounting machine 20 or feeder storage 60, management device 80 receives the attachment and detachment status from the corresponding component mounting machine 20 or the corresponding feeder storage 60, and updates the feeder holding information to the latest information. In addition, management device 80 is communicably connected to loader control device 59 wirelessly, and exchanges various information with loader 50. In addition to what has been described above, management device 80 is also communicably connected to each control device of printing device 12, print inspection device 14, and the mount inspection device, and also exchanges various information from the corresponding devices.

Figure 8:
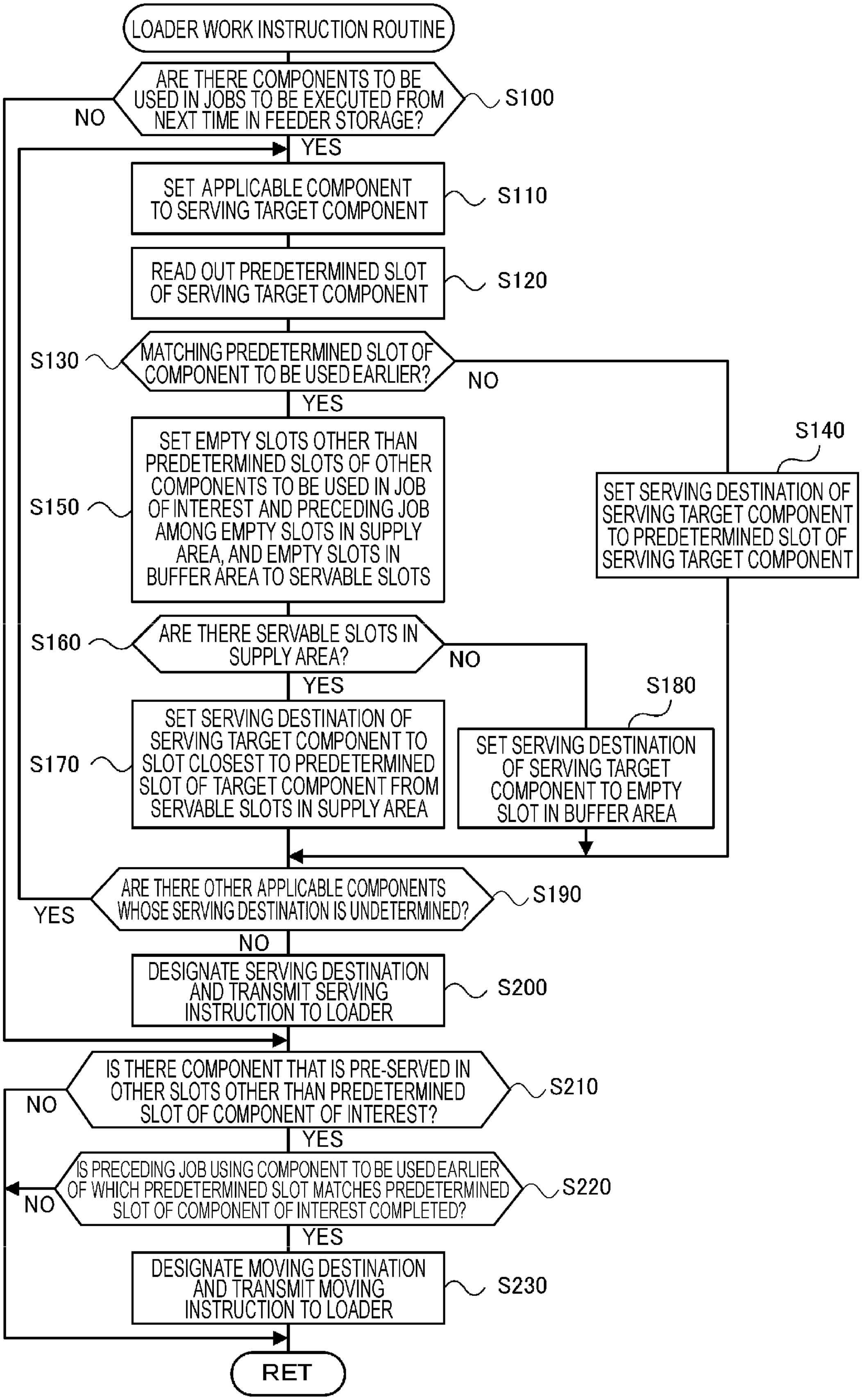
FIG. 8 is a flowchart illustrating an example of a loader work instruction routine.

Next, an operation of component mounting system 10 configured as described above will be described. In particular, an operation performed when components (feeder 30 accommodating the components) to be used in jobs to be executed from the next time are pre-served will be described. FIG. 8 is a flowchart illustrating an example of a loader work instruction routine executed by CPU 81 of management device 80. This routine is repeatedly executed every predetermined time period.

When the loader work instruction routine is executed, CPU 81 first refers to the feeder holding information illustrated in FIG. 6 to determine whether there are components (feeder 30 accommodating the components) to be used in jobs to be executed from the next time in feeder storage 60 (S100). When CPU 81 determines that there is no applicable component, the process proceeds to S210. On the other hand, when it is determined that there are applicable components, CPU 81 sets a serving target component to be served this time from the applicable components (S110), and reads out a predetermined slot of the serving target component (feeder 30 accommodating the component) from component arrangement information illustrated in FIG. 7 (S120). The predetermined slot is an arrangement position (slot number) in supply area 21A where the component to be used in the job is to be arranged, and is determined in advance by the optimization program such that the execution of the job using the component is optimized.

Next, CPU 81 extracts predetermined slots of other components (components to be used earlier) to be used in a preceding job whose execution procedure precedes a job which uses a serving target component (job of interest), and determines whether there are predetermined slots of the extracted components to be used earlier that overlap with a predetermined slot of the serving target component (S130).

This determination can be performed based on the above-described arrangement position information. When it is determined that there is no component to be used earlier of which a predetermined slot overlaps with the predetermined slot of the serving target component, CPU 81 sets the serving destination of the serving target component to the predetermined slot of the serving target component (S140).

On the other hand, when it is determined that there is a component to be used earlier of which a predetermined slot overlaps with the predetermined slot of the serving target component, CPU 81 does not set the serving destination of the serving target component to the predetermined slot of the serving target component. In a case where components to be used in jobs to be executed from the next time are pre-served, it is preferable that the pre-serving is performed in the order of the earlier order of use. However, in a case where there is a delay in the preparation of some components or a case where components are shared between lines in a component mounting system including multiple production lines, components in the earlier order of use may be provided to feeder storage 60 with delay. Therefore, when the pre-serving is performed in the earlier order of provision order to feeder storage 60, there may be a case where the components in the later order of use are pre-served earlier than the components in the earlier order of use. At this time, there may be a case where the predetermined slot of the component in the earlier order of use is obstructed by the component in the later order of use, and in order to serve the component in the earlier order of use in the predetermined slot later, it is necessary to detach the component obstructing the predetermined slot, and wasteful detachment work occurs. Therefore, in the present embodiment, in a case where the predetermined slot of the serving target component overlaps with the predetermined slot of the component to be used earlier, CPU 81 does not set the serving destination of the serving target component in the predetermined slot of the serving target component, thereby avoiding the occurrence of wasteful detachment work. That is, CPU 81 sets empty slots other than the predetermined slots of other components to be used in each of the job of interest and the preceding job among empty slots in supply area 21A, and empty slots in buffer area 21B to servable slots of the serving target component (S150). Subsequently, CPU 81 determines whether there are servable slots in any of slots 42 in supply area 21A (S160). When it is determined that there are servable slots in any of slots 42 in supply area 21A, CPU 81 sets the serving destination of the serving target component to the slot closest to the predetermined slot of the serving target component from the servable slots in supply area 21A (S170). On the other hand, when it is determined that there is no servable slot in any of slots 42 in supply area 21A, CPU 81 sets the serving destination of feeder 30 of the serving target component to the servable slots in buffer area 21B (S180). In a case where neither supply area 21A nor buffer area 21B of target component mounting machine 20 has servable slots, CPU 81 may set the serving destination of the serving target component to empty slots in supply area 21A and buffer area 21B of the vicinity component mounting machine 20.

When the serving destination of the serving target component is set in this manner, CPU 81 determines whether there are other components whose serving destination is undetermined among the components applicable to S100 (S190). When it is determined that there are other components whose serving destination is undetermined, CPU 81 returns to S110 to repeat the process of S110 to S190 for setting the next serving target component and setting the serving destination. On the other hand, when it is determined that there is no other component whose serving destination is undetermined, CPU 81 transmits a serving instruction to loader 50 such that each serving target component (feeder 30 accommodating each serving target component) is pre-served in each set serving destination (S200). Loader 50 that has received the serving instruction serves the serving target component (feeder 30 accommodating the serving target component) to the designated serving destination.

Next, CPU 81 determines whether there is a component that is pre-served in other slots other than the predetermined slot of the component of interest among the components arranged in supply area 21A and buffer area 21B of each component mounting machine 20 (S210). When it is determined that there is a component that is pre-served in other slots, CPU 81 determines whether a preceding job which uses a component to be used earlier of which a predetermined slot overlaps with the predetermined slot of the component of interest is completed (S220). When it is determined that there is no component that is pre-served in other slots other than the predetermined slot, or that the preceding job which uses the component to be used earlier of which a predetermined slot overlaps with the predetermined slot of the component of interest is not ended, CPU 81 ends the present routine.

On the other hand, when it is determined that there is a component that is pre-served in other slots other than the predetermined slot and the preceding job which uses the component to be used earlier of which a predetermined slot overlaps with the predetermined slot of the component of interest is completed, CPU 81 sets, using the corresponding component as a moving target component, a moving destination of the moving target component to the predetermined slot of the moving target component, designates the moving destination, transmits a serving instruction (movement instruction) to loader 50 (S230), and ends the present routine. Loader 50 received the movement instruction collects the used component (feeder 30) used in the preceding job from the predetermined slot, and serves the moving target component to the predetermined slot. As described above, in a case where the component to be used earlier using the slot is arranged in the predetermined slot of the component of interest, the component of interest is pre-served in an empty slot other than the original predetermined slot. The process of S230 is a process for collecting used components and moving the component of interest to the original predetermined slot in a case where the preceding job is completed and the component to be used earlier of which a predetermined slot overlaps with the predetermined slot of the component of interest is used. As described above, since the component of interest that is not arranged in the original predetermined slot is served in the slot closest to the original predetermined slot among the servable slots, a movement amount of the component of interest can be reduced when the component of interest is moved. As a result, loader 50 can quickly perform moving work of the component.

Figure 9:
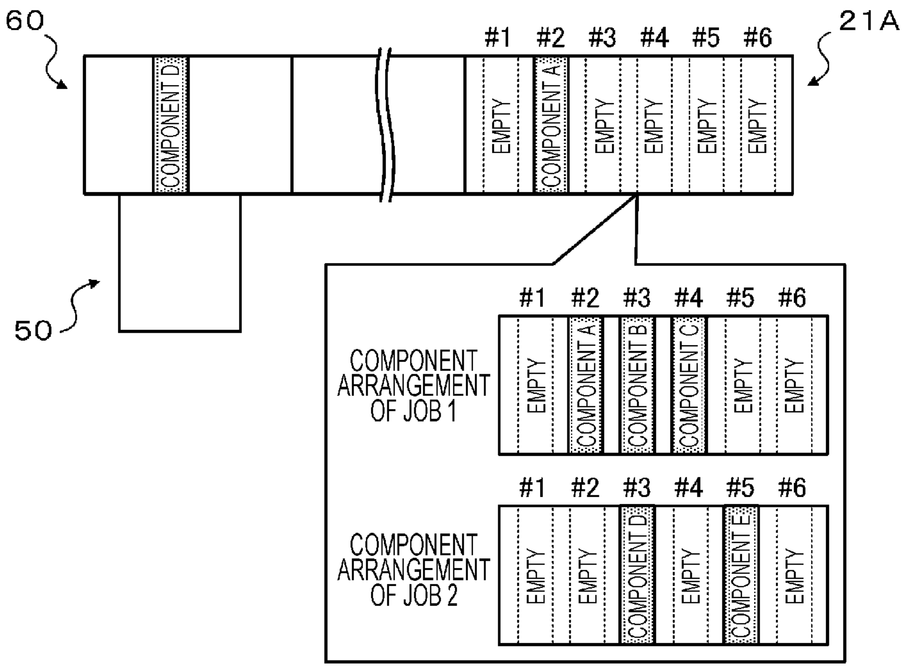
FIG. 9 is an explanatory diagram illustrating a state of a pre-serving of a component (feeder).
Figure 10:
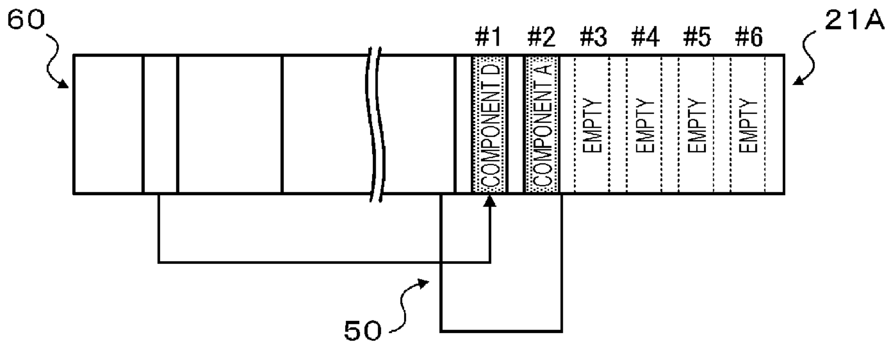
FIG. 10 is an explanatory diagram illustrating a state of a pre-serving of a component (feeder).

FIGS. 9 and 10 are explanatory diagrams illustrating a state in which a pre-serving of a component (feeder) is performed. Here, as illustrated, components A, B, and C are to be used in job 1, and arrangement positions (predetermined slots) of components A, B, and C are slots #2, #3, and #4 in this order. Components D and E are to be used in job 2 executed after job 1, and the arrangement positions (predetermined slots) of components D and E are slots #3 and #5 in this order. Hereinafter, a case where components D and E to be used in job 2 are pre-served earlier than components B and C to be used in job 1 will be described as a specific example. Currently, component A to be used in job 1 is arranged in slot #2 among slots #1 to #6 in supply area 21A, and other slots #1, #3 to #6 are empty slots. Component D used in job 2 is stored in feeder storage 60. Slot #3, which is a predetermined slot of component D is currently empty, but is not a servable slot because it is the predetermined slot of component B to be used in job 1 (preceding job) executed prior to job 2. Therefore, component D is not pre-served in slot #3. In addition, slot #4 on the right side is currently empty, but is not a servable slot because it is a predetermined slot of component C to be used in job 1 (preceding job). Therefore, component D is not pre-served in slot #4 either. Further, slot #5 on the right side is currently empty, but is not a servable slot because it is a predetermined slot of another component E to be used in the same job 1 same as component D (job of interest). Therefore, component D is not pre-served in slot #5 either. As a result, servable slots are slots #1 and #6. Component D is pre-served in slot #1 among the servable slots, which is on the side closer to the predetermined slot of component D (refer to FIG. 10). As a result, even in a case where components B and C in the earlier order of use in the job 1 which is a preceding job or another component E to be used in job 2 which is the job of interest are provided to feeder storage 60, those predetermined slots can be left empty. Accordingly, even in a case where feeders 30 of components B and C in the earlier order of use are served later, since these predetermined slots are not obstructed by component D in the later order of use, it is possible to avoid the occurrence of wasteful detachment work, so that the serving of feeder 30 can be efficiently performed.

Here, a non-limiting correspondence between elements of the present embodiment and elements of the claims will be described. That is, multiple slots 42 in supply area 21A of the present embodiment correspond to the multiple slots of the present disclosure, component mounting machine 20 corresponds to the component mounting machine, loader 50 corresponds to the work device, and CPU 81 that executes the loader work instruction routine corresponds to the management control section. Buffer area 21B corresponds to the buffer.

It is needless to say that the present disclosure is not limited to the embodiment described above in any way and can be implemented in various aspects without departing from the technical scope of the present disclosure.

Figure 11:
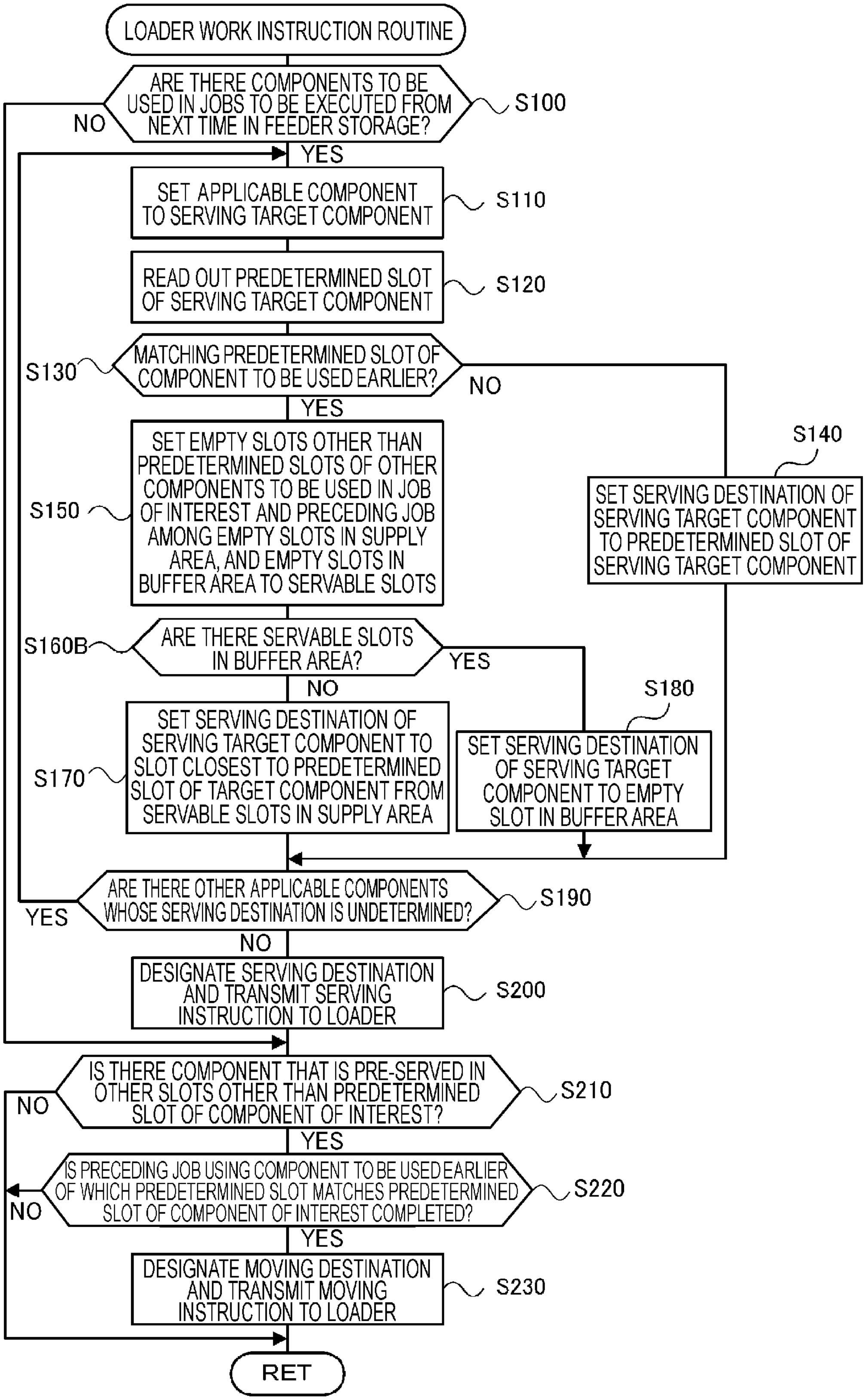
FIG. 11 is a flowchart illustrating a loader work instruction routine according to another embodiment.

For example, in the above-described embodiment, in a case where the predetermined slot of the serving target component overlaps with the predetermined slot of the component to be used earlier, CPU 81 determines the serving destination of the serving target component by giving priority to empty slots in supply area 21A among empty slots in supply area 21A and empty slots in buffer area 21B. However, CPU 81 may determine the serving destination of the serving target component by giving priority to empty slots in buffer area 21B. FIG. 11 is a flowchart illustrating a loader work instruction routine according to another embodiment. Among the respective processes of the loader work instruction routine of another embodiment, the same processes as those of the present embodiment are assigned with the same step numbers, and detailed descriptions thereof will be omitted. In the loader work instruction routine according to another embodiment, after setting servable slots in S150, CPU 81 determines whether there are servable slots in buffer area 21B (S160B). As described above, in buffer area 21B, all the empty slots among slots 42 in buffer area 21B are set as servable slots. Therefore, the determination in S160B is made as to whether there are any empty slots in buffer area 21B. When it is determined that there are servable slots, that is, empty slots in buffer area 21B, CPU 81 sets the serving destination of feeder 30 of the serving target component to the empty slots in buffer area 21B (S180). In the process of S180, in a case where there are multiple empty slots in buffer area 21B, the serving destination of the serving target component may be set to the empty slot closest to the predetermined slot among multiple empty slots. On the other hand, when it is determined that there is no servable slot in buffer area 21B, CPU 81 sets the serving destination of the serving target component to the slot closest to the predetermined slot of the serving target component among the servable slots in supply area 21A (S190). As a result, empty slots can be secured in supply area 21A. For example, in a case where the component used in the running job is expected to be in component shortage, loader 50 can avoid the suspension of the job if spare feeder 30 accommodating the same type of component as the component expected to be in component shortage is pre-served in the empty slot in supply area 21A. In this case, by securing empty slots in supply area 21A, it is possible to attach the spare feeder 30 without detaching feeder 30 already attached in supply area 21A. As a result, it is possible to efficiently perform the serving of feeder 30 by avoiding the occurrence of wasteful detachment work.

In the above-described embodiment, each component mounting machine 20 includes buffer area 21B for temporarily storing feeder 30, but needs not include buffer area 21B. In this case, the processes of S160 and S180 of the loader work instruction routine may be omitted.

As described above, the management device of the present disclosure is a management device for use in a component mounting system including a component mounting machine having multiple slots to which a feeder is attached and a mounting section configured to execute a mounting job for mounting a component by detaching the component from the feeder, and a work device configured to perform serving work and collecting work of the feeder for each slot of the component mounting machine, the device including a management control section configured to, in a case where a target feeder to be used in a target job among multiple mounting jobs to be executed by the component mounting machine is pre-served in the component mounting machine, determine whether a predetermined slot, which is a predetermined serving destination slot of the target feeder, overlaps with a predetermined slot of a feeder to be used in a preceding job executed prior to the target job, cause the work device to pre-serve the target feeder in the predetermined slot of the target feeder when predetermined slots of both feeders do not overlap with each other, and cause the work device to serve the target feeder in the predetermined slot of the target feeder after an execution of a preceding job which uses a feeder of which a predetermined slot overlaps with the predetermined slot of the target feeder is completed when the predetermined slots of both feeders overlap with each other.

In the management device of the present disclosure, even if it is necessary to serve a feeder having a high priority later, a predetermined slot of the feeder having a high priority can be left empty. Therefore, it is possible to more efficiently perform the serving of the feeder by avoiding wasteful detachment work of the feeder.

In such a management device of the present disclosure, when the predetermined slots of both feeders overlap with each other, the management control section may cause the work device to pre-serve the target feeder in an empty slot different from the predetermined slot of the target job until the execution of the preceding job which uses the feeder of which a predetermined slot overlaps with the predetermined slot of the target feeder is completed, and to move the target feeder to the predetermined slot of the target feeder after the execution of the preceding job is completed. Accordingly, by pre-serving the target feeder in another empty slot, it is possible to shorten a movement amount of the work device when causing the target feeder to move to the predetermined slot, so that the moving work can be performed in a short time. In this case, when the predetermined slots of both feeders overlap with each other, the management control section may cause the work device to pre-serve the target feeder in the slot closest to the predetermined slot of the target feeder among empty slots that do not overlap with the predetermined slots of any feeders to be used in the target job or in the preceding job, until the execution of the preceding job which uses the feeder of which a predetermined slot overlaps with the predetermined slot of the target feeder is completed. In doing so, it is possible to move the target feeder to the predetermined slot in a shorter time. In this case, the component mounting machine may further include a buffer for temporarily storing the feeder, and the management control section may cause the work device to pre-serve the target feeder in the buffer when the predetermined slots of both feeders overlap with each other and when there are no empty slots that do not overlap with predetermined slots of any feeders to be used in the target job or in the preceding job in the component mounting machine on which the target job is executed. In doing so, it is possible to pre-serve a large number of target feeders in the component mounting machine.

Alternatively, in the management device of the present disclosure, the component mounting machine may include a buffer for temporarily storing the feeder, and the management control section, when the predetermined slots of both feeders overlap with each other, may cause the work device to determine a serving destination slot by giving priority to the buffer among empty slots that are different from a predetermined slot of the target job and the buffer until the execution of a preceding job which uses a feeder of which a predetermined slot overlaps with the predetermined slot of the target feeder is completed and pre-serve the target feeder in the determined slot, and after the execution of the preceding job is completed, to move the target feeder to the predetermined slot of the target feeder. As a result, since the slot used to supply the component to the component mounting machine can be left empty, for example, a spare feeder can be attached to the slot in preparation for the component shortage.

The present disclosure is not limited to the form of a management device, but may be in the form of a management method or the form of a work device.

INDUSTRIAL APPLICABILITY

The present disclosure can be applied to a manufacturing industry of a component mounting system, a component mounting machine, a management device, or the like.

REFERENCE SIGNS LIST

10 component mounting system, 12 printing device, 14 print inspection device, 18 guide rail, 20 component mounting machine, 21 attachment target section, 21A supply area, 21B buffer area, 22 board conveyance device, 24 head moving device, 24*a* slider, 25 head, 26 mark camera, 27 parts camera, 29 mounting control device, 29*a* CPU, 29*b* ROM, 29*c* HDD, 29*d* RAM, 30 feeder, 32 tape reel, 33 tape feeding mechanism, 35 connector, 39 feeder control device, 40 feeder base, 42 slot, 45 connector, 50 loader, 51 loader moving device, 52*a* X-axis motor, 52*b* guide roller, 53 feeder transfer device, 54 clamp section, 55 Y-axis slider, 55*a* Y-axis motor, 55*b* Y-axis guide rail, 56*a* Z-axis motor, 56*b* Z-axis guide rail, 57 position sensor, 58 monitoring sensor, 59 loader control device, 60 feeder storage, 80 management device, 81 CPU, 82 ROM, 83 HDD, 84 RAM, 85 input device, 86 display

The invention claimed is:

1. A component mounting system, comprising:

a component mounting machine including multiple slots to which a feeder of multiple feeders is attachable and a mounting section configured to execute a mounting job for mounting a component by detaching the component from the feeder, the multiple feeders including a first feeder to be used in a first mounting job of the component mounting machine and a second feeder to be used in a second mounting job of the component mounting machine, the first mounting job scheduled to occur earlier than the second mounting job;

a work device configured to perform serving work and collecting work of the multiple feeders for each slot of the component mounting machine; and a management control section configured to:

determine that a second target predetermined slot, which is a predetermined serving destination slot of the second feeder, is a same slot of the multiple slots as a first target predetermined slot which is a predetermined serving destination slot of the first feeder, and cause the work device to serve the second feeder to another slot of the multiple slots different from the same slot until at least after completion of the first mounting job.

2. The component mounting system according to claim 1, the management control section is configured to:

cause the work device to pre-serve the second feeder in an empty slot different from the same slot until the completion of the first mounting job which uses the same slot, and move the second feeder to the same slot after the completion of the first mounting job.

3. The component mounting system according to claim 1, the management control section is configured to:

cause the work device to pre-serve the second feeder in a slot closest to the same slot among empty slots not used in the first mounting job and the second mounting job until the completion of the first mounting job.

4. The component mounting system according to claim 1, wherein the component mounting machine includes a buffer for temporarily storing the multiple feeders, there are no empty slots of a mounting area of the component mounting machine that are not used in the first mounting job and the second mounting job, the management control section is configured to cause the work device to pre-serve the second feeder to the buffer.

5. The component mounting system according to claim 1, wherein the component mounting machine includes a buffer for temporarily storing the multiple feeders, the management control section is configured to cause the work device to determine a serving destination slot by giving priority to the buffer among empty slots that are different from the same slot and the buffer until the completion of the first mounting job, and pre-serve the second feeder to the same slot after the completion of the first mounting job.

6. A management method for use in a component mounting system including a component mounting machine including multiple slots to which a feeder of multiple feeders configured to accommodate a component is attachable and a mounting section configured to execute a mounting job for mounting the component by detaching the component from the feeder, the multiple feeders including a first feeder to be used in a first mounting job of the component mounting machine and a second feeder to be used in a second mounting job of the component mounting machine, the first mounting job scheduled to occur earlier than the second mounting job, and a work device configured to perform serving work and collecting work of the multiple feeders for each slot of the component mounting machine, the management method comprising:

determining that a second target predetermined slot, which is a predetermined serving destination slot of the second feeder, is a same slot of the multiple slots as a first target predetermined slot which is a predetermined serving destination slot of the first feeder; and causing the work device to serve the second feeder to another slot of the multiple slots different from the same slot until at least after completion of the first mounting job.

* * * * *